(12) United States Patent
Fujii et al.

(10) Patent No.: US 7,842,976 B2
(45) Date of Patent: Nov. 30, 2010

(54) SEMICONDUCTOR DEVICE HAVING MOS TRANSISTORS WHICH ARE SERIALLY CONNECTED VIA CONTACTS AND CONDUCTION LAYER

(75) Inventors: Isamu Fujii, Tokyo (JP); Shinichi Miyatake, Tokyo (JP); Yuko Watanabe, Tokyo (JP); Homare Sato, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 53 days.

(21) Appl. No.: 12/259,527

(22) Filed: Oct. 28, 2008

(65) Prior Publication Data

US 2009/0108376 A1    Apr. 30, 2009

(30) Foreign Application Priority Data

Oct. 30, 2007    (JP) .............................. 2007-282035

(51) Int. Cl.
*H01L 27/10* (2006.01)
*H01L 29/73* (2006.01)
*H01L 29/74* (2006.01)

(52) U.S. Cl. ................. 257/206; 257/211; 257/369; 257/E27.014

(58) Field of Classification Search .................. 257/206, 257/211, 369, E27.014
See application file for complete search history.

(56) References Cited

U.S. PATENT DOCUMENTS

| 6,133,582 | A  | * | 10/2000 | Osann et al. ............. 257/48 |
| 7,547,973 | B2 | * | 6/2009  | Matsuno .................. 257/773 |
| 2008/0283873 | A1 | * | 11/2008 | Yang et al. .............. 257/211 |
| 2009/0026503 | A1 | * | 1/2009  | Tsuda ..................... 257/211 |

FOREIGN PATENT DOCUMENTS

| JP | 2001-332087 | 11/2001 |
| JP | 2007-122834 | 5/2007  |

* cited by examiner

*Primary Examiner*—Ngan Ngo
(74) *Attorney, Agent, or Firm*—Young & Thompson

(57) ABSTRACT

A semiconductor device includes a plurality of signal lines which are arranged at a predetermined pitch; first and second MOS transistors which are connected to the signal lines, and also serially connected to each other; and a connection device which functions as a connection node between the serially-connected first and second MOS transistors, and connects a source area of one of the first and second MOS transistors to a drain area of the other of the first and second MOS transistors via contact holes, which are formed through an insulating layer, and a conduction layer connected to the contact holes.

21 Claims, 8 Drawing Sheets

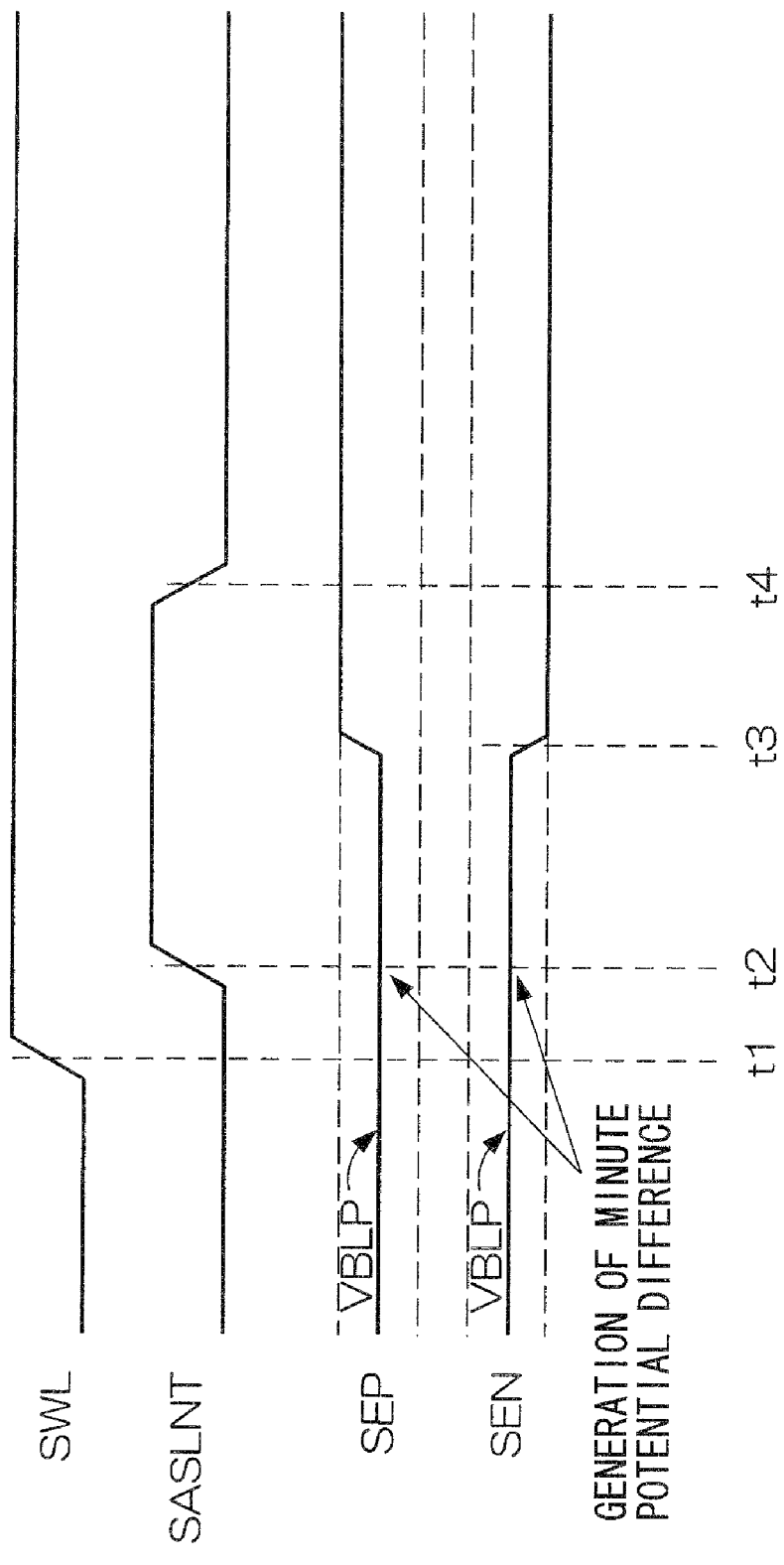

SEMICONDUCTOR DEVICE HAVING MOS TRANSISTORS WHICH ARE SERIALLY CONNECTED VIA CONTACTS AND CONDUCTION LAYER

BACKGROUND OF THE INVENTION

1. Field of the Invention

The present invention relates to a semiconductor device such as a semiconductor memory device, which can be preferably applied to circuit blocks arranged at a small pitch in the vicinity of a memory cell array.

Priority is claimed on Japanese Patent Application No. 2007-282035, filed Oct. 30, 2007, the contents of which are incorporated herein by reference.

2. Description of Related Art

In accordance with recent progress in digital techniques, portable digital apparatuses such as a cellular phone and a portable media player have been manufactured, and technical innovation has rapidly progressed. Such technical innovation for portable apparatuses includes, not only improvement in processing performance, but also in size-reduction or longer operation time of the apparatuses. Therefore, size-reduction and lower-power consumption (by voltage reduction or the like) are required for semiconductor devices installed in the portable apparatuses.

For a DRAM (dynamic random access memory), which is one of the semiconductor devices, not only size-reduction but also an increase in memory capacity is required, and thus highly integrated structures have been developed. For such highly integrated structures of DRAMs, various designs have been proposed. For example, a novel technique has been developed for the layout of bit-line pairs, which are connected to memory cells and arranged at a small pitch (see, for example, Patent Document 1: Japanese Unexamined Patent Application, First Publication No. 2007-122834).

Also for the lower-power consumption of DRAMs, various methods have been examined. DRAMs require regular memory refreshing, and slight electric current flows through the memory cells (i.e., memory elements). Therefore, the amount of data stored in the memory cells decreases as time elapses. If the amount of decrease in the stored data exceeds a specific limit, the data cannot be accurately read, that is, the data is destroyed. In order to solve this problem, sense amplifiers are driven at regular intervals, so as to perform memory refreshing in which re-amplified data is restored in the relevant memory cells. Among the operations of DRAMs, the above memory refreshing causes large power consumption, and how to decrease such power consumption has been examined for DRAMs which are used in portable apparatuses.

Here, a decrease of the operating voltage of each sense amplifier is effective for reducing the power consumption. However, the sense amplifier amplifies a very small differential potential of the relevant bit-line pair. Therefore, if the operating voltage is decreased, the operation speed may decrease, or sufficient amplification may not be performed.

In a known method for maintaining desired performance of sense amplifiers even with a low operating voltage, the threshold voltage (indicated by "Vt" in this specification) of transistors, which form each sense amplifier, is lowered. However, when the amplification of the differential potential of the relevant bit-line pair has been saturated, a leakage current flows through a CMOS (complementary metal oxide semiconductor) flip-flop, which is a major element of the relevant sense amplifier, where the lower the threshold voltage Vt the larger the leakage current. The dependence relationship between Vt and the leakage current is not linear, and a few-ten-percent difference in Vt may cause a difference of a few figures in the leakage current. Increase in the leakage current directly causes an increase in the power consumption Therefore, the method of lowering Vt easily reaches a limit, and methods using a circuit technique have been examined.

FIG. 1 of Patent Document 2 (Japanese Unexamined Patent Application First Publication No. 2001-332087, also see pages 6 to 9) shows a sense amplifier provided by a circuit technique in which a sort of the amplification circuit is added to a CMOS flip-flop so as to perform amplification, which differs from that of the CMOS flip-flop, in an initial stage of the relevant sensing (i.e., perform presensing). Below, such an additional amplification circuit is called a "presense amplifier".

As the presense amplifier is an additional circuit, it increases the circuit area of the sense amplifier. Generally, the sense amplifier is repeatedly arranged (i.e., many sense amplifiers are arranged). Therefore, only a slight increase of each sense amplifier in the circuit area causes a large influence on the total area of the relevant semiconductor memory. Accordingly, it is preferable to provide a circuit arrangement which requires a small number of new structural elements, or a small number of necessary control signals. The presense amplifier in FIG. 1 of Patent Document 2 needs seven transistors and two control signals as dedicate elements and signals.

In addition, the presense amplifier is not an ordinary-use circuit such as a CMOS flip-flop, and a standard circuit structure thereof has not yet been established. Probably various examinations will be performed in the relevant technical field.

SUMMARY

The present invention was provided during an examination for reduction in size and power consumption of semiconductor devices.

In one embodiment, there is provided a semiconductor device that includes:

a plurality of signal lines which are arranged at a predetermined pitch;

first and second MOS transistors which are connected to the signal lines, and also serially connected to each other; and a connection device which functions as a connection node between the serially-connected first and second MOS transistors, and connects a source area of one of the first and second MOS transistors to a drain area of the other of the first and second MOS transistors via contact holes, which are formed through an insulating layer, and a conduction layer connected to the contact holes.

In another embodiment, there is provided a semiconductor device that includes:

a first bit line and a second bit line which form a signal pair and to which a plurality of memory cells are connected;

a first MOS transistor connected to the first bit line;

a second MOS transistor connected to the second bit line;

a third MOS transistor which is serially connected to the first MOS transistor, wherein the gate electrode of the third MOS transistor is connected to the second bit line;

a fourth MOS transistor which is serially connected to the second MOS transistor, wherein the gate electrode of the fourth MOS transistor is connected to the first bit line;

a first connection device which functions as a connection node between the serially-connected first and third MOS transistors, and connects a source area of one of the first and third MOS transistors to a drain area of the other of the first and third MOS transistors via contact holes, which are formed through an insulating layer, and a conduction layer connected to the contact holes; and a second connection device which functions as a connection node between the serially-connected second and fourth MOS transistors, and connects a source area of one of the second and fourth MOS transistors to a drain area of the other of the second and fourth MOS transistors via contact holes, which are formed through an insulating layer, and a conduction layer connected to the contact holes.

In accordance with the present invention having the above connection device or the first and second connection devices, each transistor can be easily and efficiently arranged when circuit blocks having intermediate nodes are arranged at a small pitch, so that the relevant layout area can be reduced.

BRIEF DESCRIPTION OF THE DRAWINGS

The above features and advantages of the present invention will be more apparent from the following description of certain preferred embodiments taken in conjunction with the accompanying drawings, in which:

FIG. 2 is a signal waveform diagram for explaining a driving operation of the sense amplifier SA in FIG. 1.

FIG. 3A shows active areas, gate electrodes, and contact mask patterns; FIG. 3B shows tungsten wiring mask patterns; and FIG. 3C shows tungsten wiring lines and aluminium wiring mask patterns.

FIG. 5A shows active areas, gate electrodes, and contact mask patterns; FIG. 5B shows tungsten wiring mask patterns; and FIG. 5C shows tungsten wiring lines and aluminium wiring mask patterns.

DETAILED DESCRIPTION OF PREFERRED EMBODIMENTS

Before describing the present invention, problems to be solved by the present invention will be explained with reference to the drawings.

Figure 7:
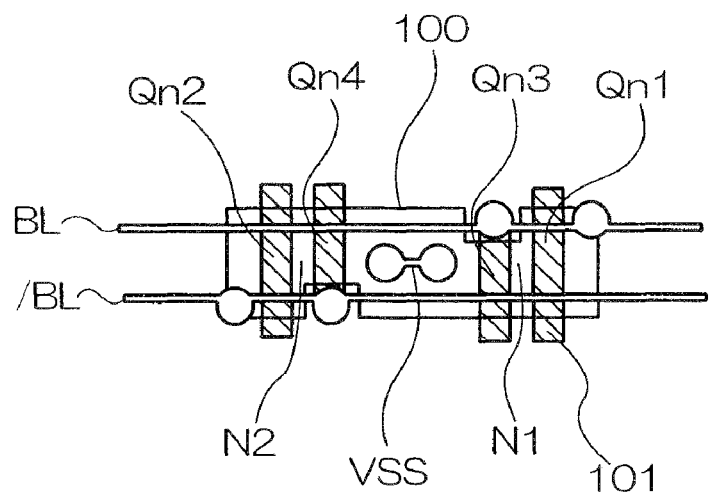
FIG. 7 is a schematic diagram showing an originally-examined mask layout of a main part of a sense amplifier.

For a sense amplifier circuit shown in FIG. 1 (which will be explained in detail when one embodiment of the present invention will be explained), FIG. 7 is a schematic diagram showing an originally-examined mask layout of MOS (metal oxide semiconductor) transistors Qn1, Qn2, Qn3, and Qn4, which form a presense amplifier.

Generally, when arranging a serial circuit of MOS transistors, typically, MOS transistors Qn1 and Qn3 whose intermediate node is not connected to another device, gate electrodes 101 of the MOS transistors Qn1 and Qn3 are formed via a gate insulating film (not shown) on an active area 100 which is surrounded by an element-separating area by means of STI (shallow trench isolation) or the like, in a manner such that both gate electrodes 101 are close to each other via a minimum interval at which the gate electrodes 101 can be formed by lithography. If N-type impurities (e.g., arsenic) are doped in a self-aligned manner into the surface of a silicon substrate in the active area 100 by using the gate electrodes of the MOS transistors Qn1 and Qn3 as a mask, then an N-type source/drain impurity diffusion area is formed in an area N1, thereby forming serially-connected MOS transistors Qn1 and Qn3.

The above layout method can minimize, not only the occupied area on the relevant semiconductor substrate, but also stray capacitance at the intermediate node between serially-connected MOS transistors. Therefore, this method is effectively used for high-speed operation and low power consumption.

However, in circuit blocks (e.g., driver circuits or sense amplifies for word or bit lines of a semiconductor memory) which are arranged at a very small pitch, some problems occur when the circuit blocks include serially-connected MOS transistors.

Generally, when arranging such elongated and arrayed circuit blocks, each common node (e.g., a node (or element terminal) for a driving signal, a node for power-supply potential or ground, or the like), which can be used by adjacent circuit blocks, is commonly used at the boundary between the relevant adjacent circuit blocks. In contrast, each intermediate node of serially-connected MOS transistors cannot be commonly used with another element, and thus it is difficult to determine the layout therefor.

More specifically, as shown in FIG. 7, when the gate electrodes 101 extend in a direction perpendicular to the direction in which bit lines BL and /BL (which are complementary signal lines) extend, a sufficient channel width cannot be provided in the relevant MOS transistors, and desired circuit characteristics may not be obtained. In this case, the operation speed of the presense amplifier is insufficient, and a reliable differential signal cannot be obtained at the pit-line pair which consists of the bit lines BL and /BL.

If the extending direction of the gate electrodes is rotated by 90 degrees so that it coincides with the direction of the bit lines (this case is not shown), two sufficient gate lengths and a sufficient pattern margin between the relevant gate and contact may not be provided between the relevant bit lines, that is, a mismatch with the existing bit-line pitch occurs, which may cause a large increase in the occupied area on the surface of the relevant semiconductor chip.

Recently, for memory-cell areas, extreme fining or densification occurs due to, for example, a self-aligned contact opening technique. Accordingly, dimension standards for designing high-density areas greatly differ from those for low-density areas. Therefore, in circuit blocks (e.g., driver circuits or sense amplifiers for word or bit lines) which are arranged at a very small pitch, the above-described problems should occur.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Figure 1:
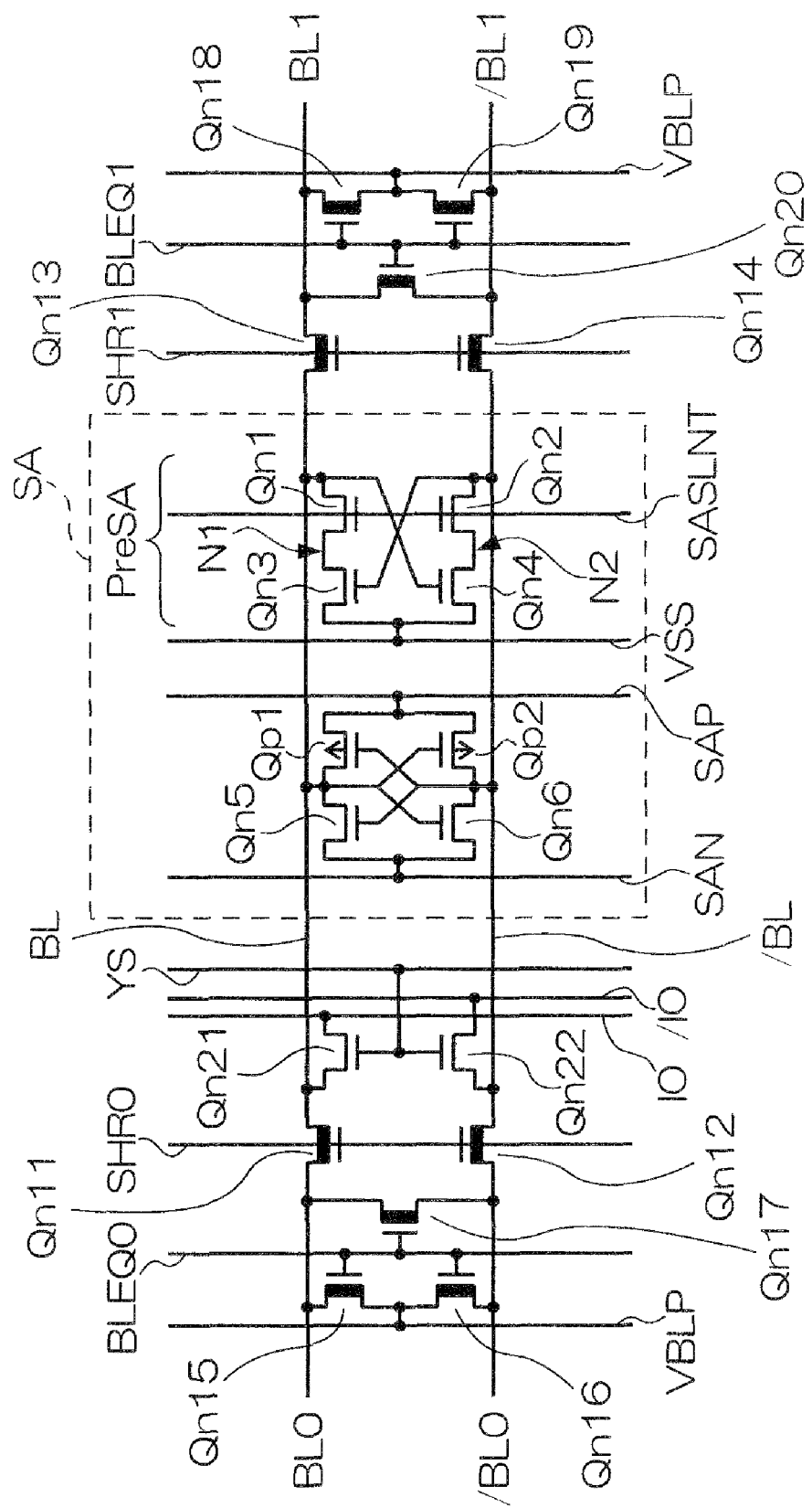
FIG. 1 is a diagram showing a sense amplifier SA, which includes serially-connected MOS transistors between bit lines beside a ground line, as a first embodiment of the present invention.
Figure 8:
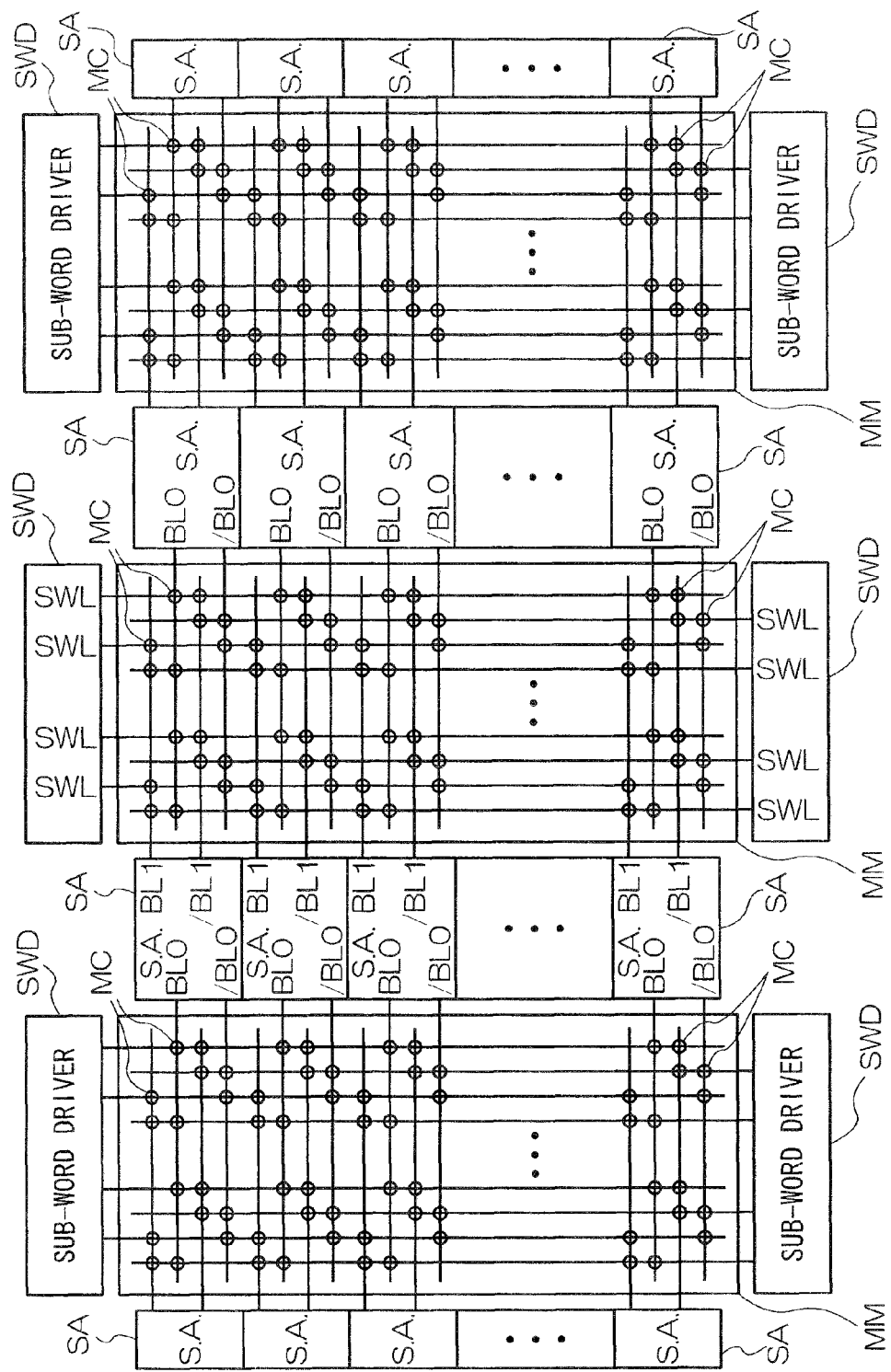
FIG. 8 is a schematic diagram showing the layout of a main part of a DRAM chip, which is a semiconductor device with respect to the first embodiment.

Referring now to FIGS. 1 and 8, a first embodiment of the present invention will be explained. FIG. 1 shows a sense amplifier circuit corresponding to low power-supply voltage, as an example of a circuit block which includes serially-connected MOS transistors and is repeatedly arranged at a very small pitch.

FIG. 8 is a schematic diagram showing the layout of a main part of a DRAM chip, which is a semiconductor device as the first embodiment of the present invention.

In the arrangement of FIG. 8, word lines SWL, which are driven by sub-word drivers SWD, are perpendicular to bit-line pairs "BL0 and /BL0" and "BL1 and /BL1", which are connected to sense amplifiers (S.A.) SA. A memory cell MC is provided at each intersection between the word lines and the bit lines. FIG. 8 shows three memory mats MM, each having the above structure. The sense amplifier circuit of FIG. 1, which corresponds to low power voltage, is an example of the specific circuit structure of each sense amplifier SA in FIG. 8.

The sense amplifier SA in FIG. 1 is a shared sense amplifier. One of the bit-line pairs of "BL0 and /BL0" and "BL1 and /BL1" (to which the corresponding memory cells MC (see FIG. 8) are connected) is selectively connected to the sense amplifier SA by using the MOS transistors Qn11, On12, Qn13, and Qn14, which are controlled by control signals SHR0 and SHR1. Here, the bit-line pairs of "BL0 and /BL0" and "BL1 and /BL1" may always be connected to the sense amplifier SA, and one of them is disconnected when the sense amplifier SA operates.

Each bit-line pair ("BL0 and /BL0" or "BL1 and /BL1") has an intermediate potential VBLP by means of precharge balancing which uses MOS transistors Qn15, Qn16, Qn17, Qn18, Qn19, and Qn20, which are controlled by bit-line precharge balance signals (or precharge signals) BLEQ0 and BLEQ1.

The sense amplifier also includes a CMOS flip-flop which is formed using P-channel pair MOS transistors Qp1 and Qp2 and N-channel pair MOS transistors Qn5 and Qn6, and driven by sense amplifier driving signals SAP and SAN. In addition, pair MOS transistors Qn21 and Qn22 are provided, which are controlled by a row selection signal YS used for transferring data of the relevant bit-line pair ("BL0 and /BL0" or "BL1 and /BL1"), that is, data of the bit-line pair "BL and /BL", to IO (input/output) buses IO and /IO (IO and /IO are complementary signal lines).

When the power-supply voltage decreases, the difference between the bit-line precharge voltage VBLP and the threshold voltage Vt of the MOS transistors Qn5 and Qn6 (which are constituents of the sense amplifier SA) decreases, and the amplification performance of the sense amplifier SA using the CMOS flip-flop considerably degrades. A presense amplifier PreSA is an amplification circuit, which is provided for compensating such degradation in the amplification performance.

The presense amplifier PreSA is formed using (i) N-channel MOS transistors Qn1 and Qn3, which are serially connected between the bit line BL and a ground line VSS, and (ii) N-channel MOS transistors Qn2 and Qn4, which are serially connected between the other bit line /BL and the ground line VSS.

The source electrodes of the N-channel MOS transistors Qn3 and Qn4 are commonly connected to VSS. The gate electrode of the N-channel MOS transistor Qn3 is connected to the other bit line /BL, and the gate electrode of the N-channel MOS transistor Qn4 is connected to the bit line BL.

The gate electrodes of the N-channel MOS transistors Qn1 and Qn2 are both connected to the signal line of a presense amplifier activation signal SASLNT. When the level of the presense amplifier activation signal SASLNT is "H" (i.e., high level), the N-channel MOS transistors Qn3 and Qn4 are respectively connected to the bit lines BL and /BL. When the level of the presense amplifier activation signal SASLNT is "L" (i.e., low level), the N-channel MOS transistors Qn3 and Qn4 are respectively disconnected from the bit lines BL and /BL.

The N-channel MOS transistors Qn3 and Qn4 have an extremely low Vt, and transistor pair for performing determinations for minute signal. Therefore, in the present arrangement, the lengths of the gate channels thereof are larger than those of the other transistors, and have a small difference therebetween. In addition, the gate channels each have a sufficient channel width, so as to provide a sufficient difference in conductance between the channels in the relevant determination operation.

In FIG. 1, N1 indicates an intermediate node between the serially-connected N-channel MOS transistors Qn1 and Qn3, and N2 indicates an intermediate node between the serially-connected N-channel MOS transistors Qn2 and Qn4, FIG. 2 is a signal waveform diagram for the read operation of the sense amplifier SA in FIG. 1. FIG. 2 shows (i) the signal level of a selected word line SWL (see FIG. 8), (ii) the level of the presense amplifier activation signal SASLNT, and (iii) levels "SEP" and "SEN" of the bit lines "BL and /BL" or "/BL and BL".

At time t1, the level of the word line SWL, which has been selected based on an address signal (not shown) input from an external device, shifts from L to H, so that electric charge transmission and reception occur between the selected memory cell MC and the bit lines "BL0 and /BL0" or "BL1 and /BL1", which have been kept at the intermediate potential VBLP by the bit-line precharge balance signals BLEQ0 and BLEQ1. Accordingly, a minute differential potential is produced between the bit lines "BL0 and /BL0" or "BL1 and /BL1". In this process, even though it is not shown in FIG. 2, the bit lines "BL0 and /BL0" or "BL1 and /BL1", which belong to the memory mats MM which include no selected memory cell MC, are disconnected from the relevant sense amplifier SA by means of the control signals SHR0 and SHR1. The following explanation employs a case in which the selected memory cell MC belongs to the relevant bit lines "BL0 and /BL0", that is, the MOS transistors Qn11 and Qn12 are ON (i.e., in the on-state), and the MOS transistors Qn13 and Qn14 are OFF (i.e., in the off-state).

Next, at time t2, when the level of the presense amplifier activation signal SASLNT shifts from L to H, the N-channel MOS transistors Qn1 and Qn2 start electric conduction, and a difference in conductance occurs between the N-channel MOS transistors Qn3 and Qn4 in accordance with the minute differential potential between the bit-line pair "BL0 and /BL0". Accordingly, the potential of one of the bit lines decreases through discharge, which amplifies the differential potential.

At time t3 when a sufficient differential potential is produced, the CMOS flip-flop, which consists of the MOS transistors Qp1, Qp2, Qn5, and Qn6 in the sense amplifier SA, is activated using the sense amplifier driving signals SAP and SAN. After that, at time t4, the level of the presense amplifier activation signal SASLNT is shifted from H to L, so as to deactivate the presense amplifier PreSA.

The commonly-connected source electrodes of the N-channel MOS transistors Qn3 and Qn4 may be driven by a method similar to a method using the sense amplifier driving signal SAN. In addition, the conductive type of the four MOS transistors which form the presense amplifier PreSA may be a P-channel type. In this case, the potential of the commonly-connected source electrodes or the presense amplifier activation signal SASLNT, of course, change in accordance with the different conductive type.

Similar to the read operation, in the write operation of the sense amplifier SA, the presense amplifier PreSA and the CMOS flip-flop, which form the sense amplifier SA, are operated in turn.

In FIG. 2, the presense amplifier PreSA is operated in the initial stage of the operation of the sense amplifier SA. However, the presense amplifier PreSA may be operated again at the actual data read/write timing through the connected IO buses. At this timing, the CMOS flip-flop in the sense amplifier SA is operating, and the presense amplifier PreSA is also operated. Therefore, the total driving performance of the sense amplifier SA can be improved.

Figures 3A, 3B, 3C:
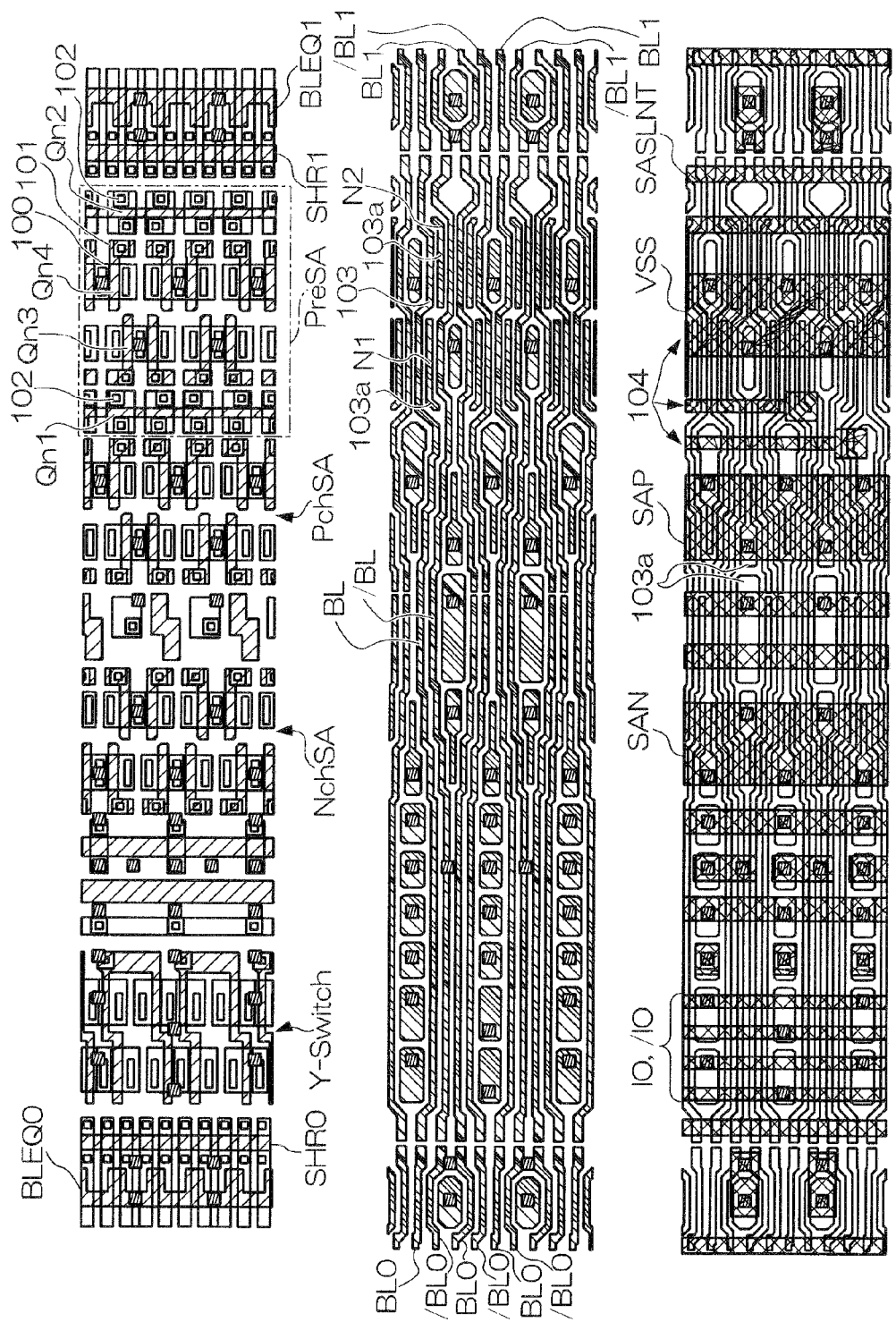
FIGS. 3A to 3C are diagrams showing mask layouts with respect to the sense amplifiers SA in FIG. 1, where

FIGS. 3A to 3C show mask layouts with respect to the sense amplifiers SA, where FIG. 3A shows active areas, gate electrodes (see shaded parts by means of slant lines having relatively large intervals), and contact mask patterns; FIG. 3B shows tungsten wiring mask patterns (see shaded parts); and FIG. 3C shows tungsten wiring lines and aluminium wiring mask patterns (see shaded parts in a lattice form).

That is, the layer shown in FIG. 3B functions as an upper layer on the layer shown in FIG. 3A, and the layer shown in FIG. 3C is an upper layer which is further deposited on the layer of FIG. 3B. An insulating layer is formed between each adjacent pair of the above layers. In order to connect any adjacent layers, an opening is provided through the relevant insulating film by using the contact mask pattern, and a connection wiring line is provided using a specific conductive layer. Here, the tungsten wiring lines and the aluminium wiring lines each form a conductive layer.

Figure 4:
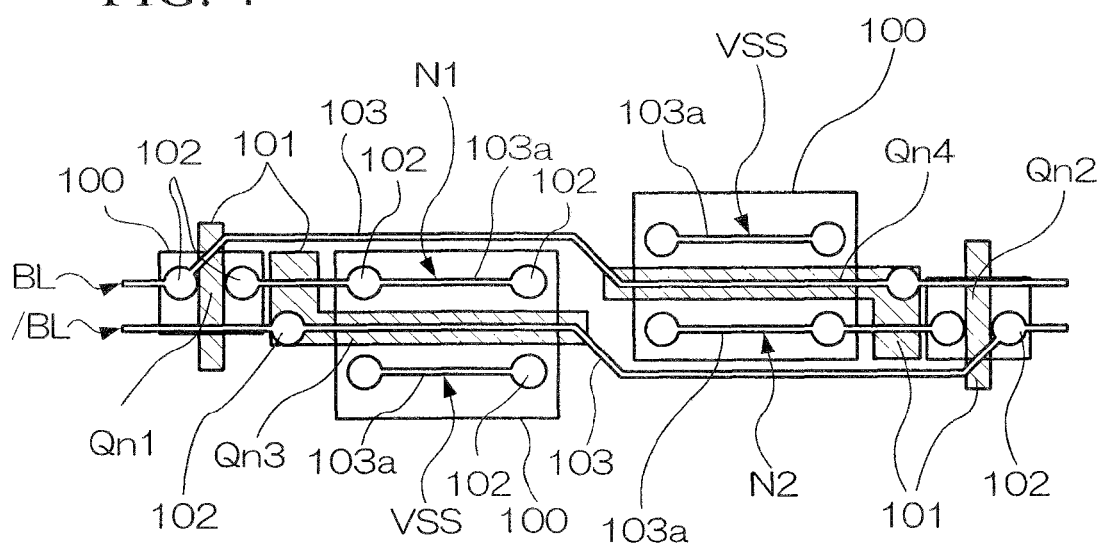
FIG. 4 is a schematic diagram showing a mask layout of the presense amplifier PreSA, which is the major part of the first embodiment.

FIG. 4 is a schematic diagram showing a mask layout of the presense amplifier PreSA, which is the major part of the present embodiment.

More specifically, FIG. 3A shows the shape and arrangement of the MOS transistors Qn1, Qn2, Qn3, and Qn4 by using active areas 100, gate electrode (patterns) 101, and contact or contact hole (mask patterns) 102.

The MOS transistors Qn1 and Qn2 are positioned at the most outer side in the relevant presense amplifier area, that is, both ends thereof. In FIG. 3A, the N-channel MOS transistors Qn5 and Qn6 (see FIG. 1) are indicated using a reference symbol NchSA, and the P-channel MOS transistors Qp1 and Qp2 are indicated using a reference symbol PchSA. In addition, the MOS transistors Qn21 and Qn22 are indicated using a reference symbol Y-Switch.

FIG. 3B shows that the bit-line pairs "BL0 and /BL0" and "BL1 and /BL1" and also the bit-line pairs "BL and /BL" corresponding thereto in the sense amplifier SA are formed using tungsten wiring lines 103. In addition, the relevant source and drain of the MOS transistors Qn1 and Qn3 are connected to each other via a contact hole by using the tungsten wiring line N1 (corresponding to the relevant intermediate node). Similarly, the relevant source and drain of the MOS transistors Qn2 and Qn4 are connected to each other via a contact hole by using the tungsten wiring line N2 (corresponding to the relevant intermediate node).

FIG. 3C shows layers of aluminium wiring lines 104, which are formed via inter-layer insulating films and extend in a direction perpendicular to the extending direction of the bit lines which are formed using the tungsten wiring lines 103. The aluminium wiring lines 104 are used for commonly supplying the sense amplifier driving signals SAP and SAN, the presense amplifier activation signal SASLNT, and the ground potential VSS to a plurality of sense amplifier (SA) blocks, and are connected to the relevant source and drain electrodes via the corresponding tungsten wiring lines 103a having an island shape. As shown in FIG. 3B, the above island-shaped tungsten wiring lines 103a and the connection lines N1 and N2 (also formed using the tungsten wiring lines 103a) between the relevant source and drain electrodes are each arranged so as to be interposed by the relevant bit lines "BL0 and /BL0" and "BL1 and /BL1", and the corresponding bit lines "BL and /BL" in the sense amplifier SA.

Figure 9:
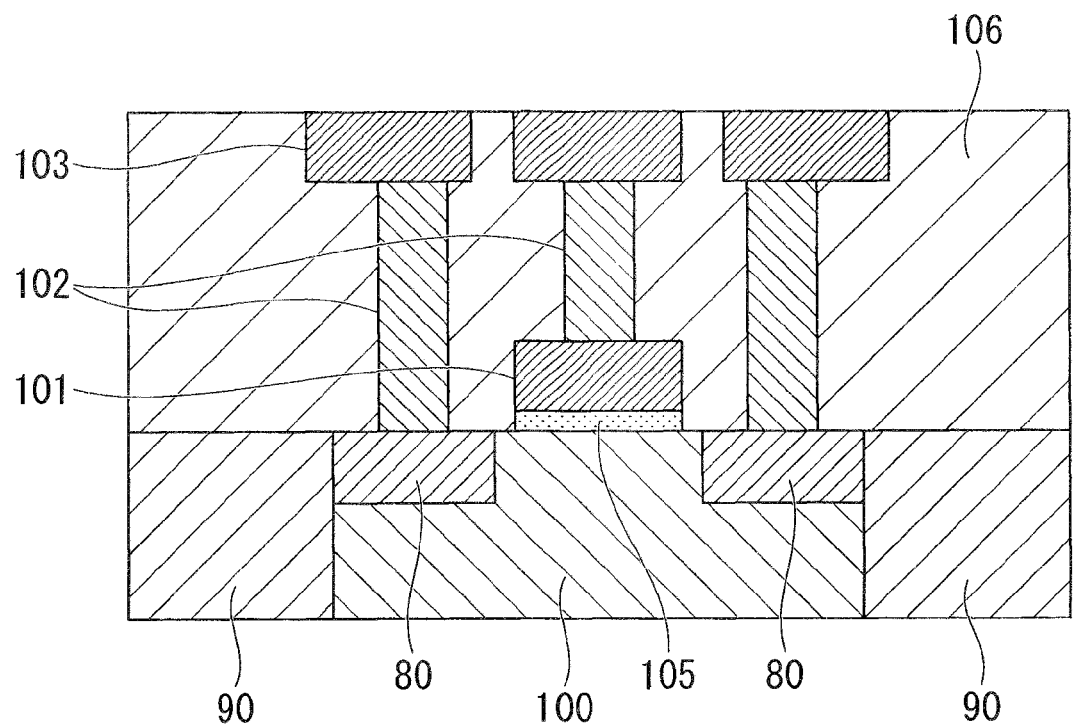
FIG. 9 is a diagram showing the general sectional structure of each relevant MOS transistor.

FIG. 9 is a diagram showing the general sectional structure of each MOS transistor. As shown in FIG. 9, in the active area 100 surrounded by an element-separating area 90, impurity diffusion areas 80 for the relevant source and drain are formed. Between the impurity diffusion areas 80 (i.e., between the source and drain), a gate electrode 101 is formed via an gate insulating film 105 which is deposited on the active area 100, in a manner such that a channel (area) is formed between the source and drain. On the impurity diffusion areas 80 (i.e., source and drain areas) and the gate electrode 101, contact holes 102 are formed through an insulating film 106, where conductive contact plugs are formed through the contact holes 102. The tungsten wiring lines 103 (which may be tungsten wiring lines 103a) are connected to the contact holes 102 (i.e., to the contact plugs).

FIG. 4 is a schematic diagram showing the connection lines in the presense amplifier PreSA. In FIG. 4, for the ground wiring line VSS, only the corresponding tungsten wiring line 103a (for connection use) is shown, and the relevant aluminium wiring line 104 is not shown. In addition, the tungsten wiring line 103a for the ground wiring line VSS is commonly used between the relevant adjacent presense amplifiers PreSA.

As shown in FIGS. 3A to 4, in the present embodiment, the gate electrodes 101 of the MOS transistors Qn3 and Qn4, which have a low Vt, each provide a straight gate (see the longer part of each L-shaped portion), which extends substantially in parallel to the extending direction of the bit-line pair "BL and /BL". In addition, the above straight gates are substantially perpendicular to the gate electrodes 101 of the MOS transistors Qn1 and Qn2, which are used for connecting or disconnecting the MOS transistors Qn3 and Qn4 to or from the bit lines "BL and /BL". Additionally, the intermediate nodes N1 and N2 are formed by using the island-shaped tungsten wiring lines 103a, which are provided between the bit lines "BL and /BL". The signal lines from the sources of the MOS transistors Qn3 and Qn4, which have a low Vt, to the ground line VSS are also formed by using the tungsten wiring lines 103a.

Therefore, in the above-described present embodiment, wiring of the MOS transistors Qn3 and Qn4 (which have a low Vt) to the intermediate nodes N1 and N2 are performed using the island-shaped tungsten wiring lines 103a, and connection from Qn3 and Qn4 to the ground wiring line VSS is also performed using the island-shaped tungsten wiring lines 103a. Therefore, even when the extending direction of the gate electrodes 101 of the MOS transistors Qn3 and Qn4 (which have a low Vt) is identical to the extending direction of the bit lines "BL and /BL", it is possible to easily provide sufficient two gate lengths and a desired pattern margin between the relevant gate and contact. Therefore, no mismatch with the bitline pitch occurs, and it is possible to prevent a large increase in the occupied area on the surface of the relevant semiconductor chip. In addition, as the extending direction of the gate electrodes 101 of the MOS transistors Qn3 and Qn4 (which have a low Vt) is identical to the extending direction of the bit lines "BL and /BL", a sufficient channel width of the relevant MOS transistor can be provided, thereby easily obtaining desired circuit characteristics (e.g., voltage reduction).

When the gate electrodes 101 of the MOS transistors Qn1, Qn2, Qn3, and Qn4 and the tungsten wiring lines 103 and 103a are arranged as symmetrical as possible both in the right-to-left direction and in the upper-to-lower direction, it is possible to easily reduce the layout size, and to provide a sufficient space for providing the tungsten-island parts.

Next, a second embodiment of the present invention will be explained with reference to FIGS. 5A to 5C and 6.

Figure 5A:
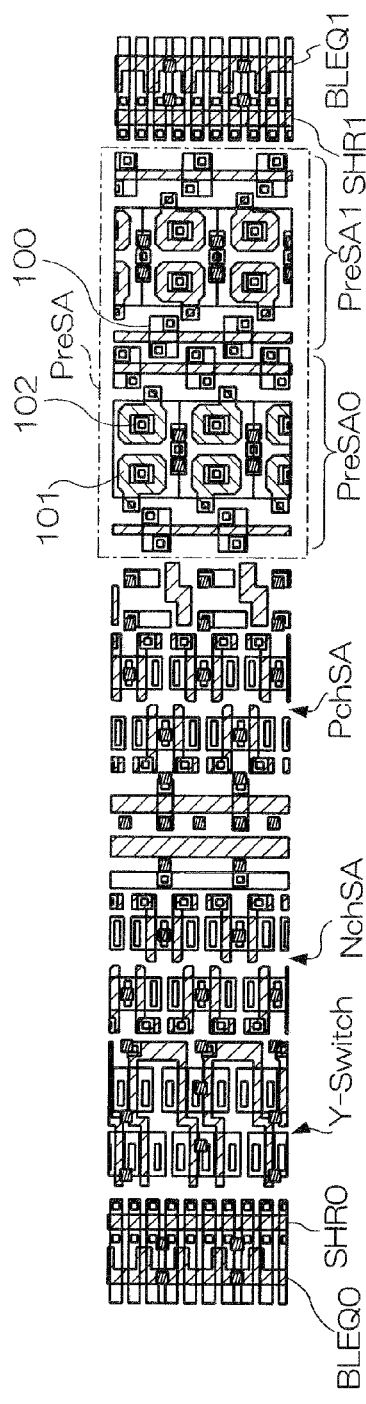
FIGS. 5A to 5C are diagrams showing a second embodiment of the present invention, where
Figure 5B:
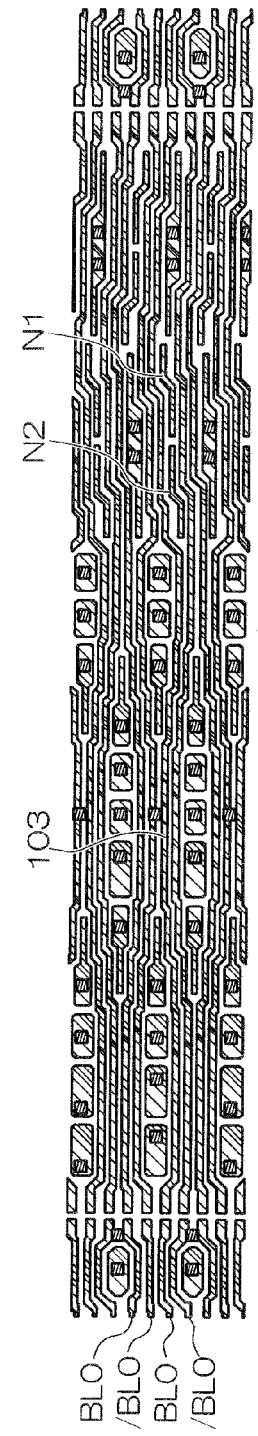
Figure 5C:
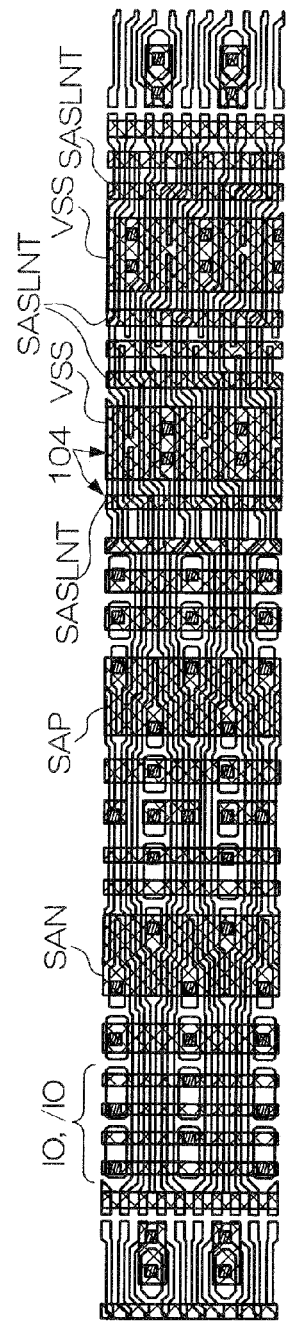

FIGS. 5A to 5C show mask layouts of the second embodiment with respect to the sense amplifier SA in FIG. 1. Similar to FIGS. 3A to 3C, FIG. 5A shows active areas, gate electrodes (see shaded parts by means of slant lines having relatively large intervals), and contact mask patterns (see double-(substantially) square parts); FIG. 5B shows tungsten wiring mask patterns (see shaded parts); and FIG. 5C shows tungsten wiring lines and aluminium, wiring mask patterns (see shaded parts in a lattice form).

Figure 6:
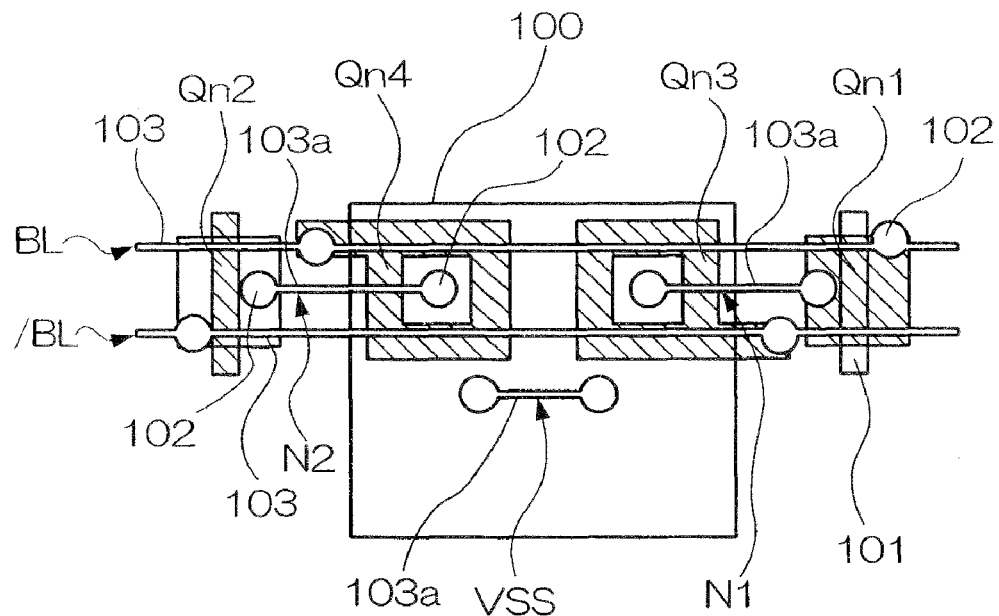
FIG. 6 is a schematic diagram showing a mask layout of the presense amplifier PreSA, which is the major part of the second embodiment.

FIG. 6 is a schematic diagram showing a mask layout of the presense amplifier PreSA, which is a distinctive part of the second embodiment.

In comparison with the first embodiment shown in FIGS. 3A to 3C, the present embodiment has distinctive features such that (i) the N-channel MOS transistors Qn3 and Qn4 each have a ring shape, and (ii) two presense amplifiers PreSA are aligned in the extending direction of the bit lines "BL and /BL". More specifically, two presense amplifiers PreSA0 and PreSA1 for the adjacent bit-line pairs "BL0 and /BL0" and "BL1 and /BL1" are arranged side by side in the extending direction of the bit lines "BL and /BL". In this case, the bit-line pairs "BL and /BL" in the presense amplifier PreSA0 and the bit-line pairs "BL and /BL" in the presense amplifier PreSA1 are connected to each other between the relevant bit-line pairs "BL0 and /BL0" and "BL1 and /BL1".

Also in the present embodiment, in the presense amplifier PreSA block, each presense amplifier PreSA0 is offset from the corresponding presense amplifier PreSA1 in a direction perpendicular to the extending direction of the bit lines by a predetermined distance (e.g., half pitch as shown in FIG. 5A). Accordingly, there is a half-pitch offset in the bit-line arrangement between the presense amplifier PreSA0 and the presense amplifier PreSA1. Therefore, between both pre-sense amplifiers, the MOS transistors Qn3 and Qn4, which have a low Vt, and the MOS transistors Qn1 and Qn2, which are used for connecting or disconnecting the MOS transistors Qn3 and Qn4 to and from the relevant bit lines "BL and /BL", can be arranged more closely in the extending direction of the bit lines (as if the MOS transistors of both presense amplifiers protrude to each other). Accordingly, it is possible to reduce the layout size of the sense amplifiers SA.

In addition, as the gate electrodes 101 of the MOS transistors Qn3 and Qn4, which have a low Vt, each have a ring shape, a sufficient channel width for each MOS transistor can be provided, thereby easily obtaining desired circuit characteristics (e.g. voltage reduction). Additionally, similar to the first embodiment shown in FIGS. 3A to 4, wiring of the MOS transistors Qn3 and Qn4 (which have a low Vt) to the intermediate nodes N1 and N2 are performed using the island-shaped tungsten wiring lines 103a, and connection from Qn3 and Qn4 to the ground wiring line VSS is also performed using the island-shaped tungsten wiring lines 103a. Therefore, it is possible to easily provide a desired pattern margin between the relevant gate and contact, and the like. Therefore, no mismatch with the bit-line pitch occurs, and it is possible to prevent a large increase in the occupied area on the surface of the relevant semiconductor chip.

In the "offset" arrangement (by half pitch) of the present embodiment, it is preferable that the relevant oblique wiring lines are as short as possible. In addition, when the gate electrodes 101 of the MOS transistors Qn1, Qn2, Qn3, and Qn4 and the tungsten wiring lines 103 and 103a are arranged as symmetrical as possible both in the right-to-left direction and in the upper-to-lower direction, it is possible to easily reduce the layout size, and to provide a sufficient space for providing the tungsten-island parts.

In accordance with the above-described layout structures, it is possible to obtain a semiconductor device having high performance, whose circuit arrangement occupies a small area.

It is apparent that the present invention is not limited to the above embodiments, but may be modified and changed without departing from the scope and spirit of the invention.

For example, in the above-described embodiments, the present invention is applied to a structure having sense amplifiers, each of which includes a presense amplifier. However, the present invention can be generally applied to any semiconductor device having a circuit structure in which an intermediate node of a series circuit consisting of MOS transistors can be connected via an area in a conductive layer, where the area corresponds to an area interposed by signal lines which are arranged at a specific interval and form a signal-line pair.

What is claimed is:

1. A semiconductor device comprising:
    a plurality of signal lines which are arranged at a predetermined pitch;
    a sense amplifier formed from a presense amplifier and a CMOS flip flop, the presense amplifier including first and second MOS transistors which are connected to the signal lines, and the first and second MOS transistors also being serially connected to each other; and
    a connection device which functions as a connection node between the serially-connected first and second MOS transistors, and connects a source area of one of the first and second MOS transistors to a drain area of the other of the first and second MOS transistors via contact holes, which are formed through an insulating layer, and a conduction layer connected to the contact holes.

2. A semiconductor device comprising:
    a first bit line and a second bit line which form a signal pair and to which a plurality of memory cells are connected;
    a sense amplifier formed from a presense amplifier and a CMOS flip flop;
    a first MOS transistor of the presense amplifier connected to the first bit line;
    a second MOS transistor of the presense amplifier connected to the second bit line;
    a third MOS transistor of the presense amplifier which is serially connected to the first MOS transistor, wherein the gate electrode of the third MOS transistor is connected to the second bit line;
    a fourth MOS transistor of the presense amplifier which is serially connected to the second MOS transistor, wherein the gate electrode of the fourth MOS transistor is connected to the first bit line;
    a first connection device which functions as a connection node between the serially-connected first and third MOS transistors, and connects a source area of one of the first and third MOS transistors to a drain area of the other of the first and third MOS transistors via contact holes, which are formed through an insulating layer, and a conduction layer connected to the contact holes; and a second connection device which functions as a connection node between the serially-connected second and fourth MOS transistors, and connects a source area of one of the second and fourth MOS transistors to a drain area of the other of the second and fourth MOS transistors via contact holes, which are formed through an insulating layer, and a conduction layer connected to the contact holes.

3. The semiconductor device in accordance with claim 2, wherein:
the gate electrodes of the first and second MOS transistors extend in a direction substantially perpendicular to the extending direction of the gate electrodes of the third and fourth MOS transistors; and
the extending direction of the gate electrodes of the third and fourth MOS transistors is substantially parallel to the extending direction of the first and second bit lines, which are arranged substantially in parallel.

4. The semiconductor device in accordance with claim 2, wherein:
the gate electrodes of the third and fourth MOS transistors each have a ring shape.

5. The semiconductor device in accordance with claim 2, wherein:
the position of the gate electrodes of the third and fourth MOS transistors is offset from the position of the gate electrodes of the first and second MOS transistors by a predetermined distance in a direction perpendicular to the extending direction of the first and second bit lines.

6. The semiconductor device in accordance with claim 1, wherein:
the conduction layer is an island-shaped wiring line.

7. The semiconductor device in accordance with claim 2, wherein:
each conduction layer for the first and second connection devices is an island-shaped wiring line.

8. The semiconductor device in accordance with claim 1, wherein:
the first and second MOS transistors are formed in individual active areas.

9. The semiconductor device in accordance with claim 1, wherein:
the first and second MOS transistors have the same conductive type.

10. The semiconductor device in accordance with claim 2, wherein:
the first, second, third, and fourth MOS transistors are formed in individual active areas.

11. The semiconductor device in accordance with claim 2, wherein:
the first, second, third, and fourth MOS transistors have the same conductive type.

12. A semiconductor device comprising:
a plurality of signal lines which are arranged at a predetermined pitch;
first and second MOS transistors which are connected to the signal lines, and the first and second MOS transistors also being serially connected to each other;
a connection device which functions as a connection node between the serially-connected first and second MOS transistors, and connects a source area of the first and second MOS transistors to a drain area of the other of the first and second MOS transistors via contact holes, which are formed through an insulating layer, and a conduction layer connected to the contact holes; and
third and fourth MOS transistors arranged in a manner such that the third and fourth MOS transistors are respectively adjacent to the first and second MOS transistors, wherein:
the first, second, third, and fourth MOS transistors each have a gate electrode in an individual active area;
between the adjacently-arranged first and third MOS transistors, an area interposed by the gate electrodes of the first and third MOS transistors is a common area of both transistors; and
between the adjacently-arranged second and fourth MOS transistors, an area interposed by the gate electrodes of the second and fourth MOS transistors is a common area of both transistors.

13. The semiconductor device in accordance with claim 1, wherein:
the CMOS flip-flop is formed from a P-channel pair of MOS transistors and a N-channel pair of MOS transistors, the CMOS flip flop being configured to be driven by sense amplifier driving signals.

14. The semiconductor device in accordance with claim 2, wherein:
the CMOS flip-flop is formed from a P-channel pair of MOS transistors and a N-channel pair of MOS transistors, the CMOS flip flop being configured to be driven by sense amplifier driving signals.

15. The semiconductor device in accordance with claim 1, further comprising:
a third MOS transistor of the presense amplifier which is serially connected to the first MOS transistor, wherein the gate electrode of the third MOS transistor is connected to the second bit line; and
a fourth MOS transistor of the presense amplifier which is serially connected to the second MOS transistor, wherein the gate electrode of the fourth MOS transistor is connected to the first bit line,
wherein the third MOS transistor and the fourth MOS transistor form a transistor pair for determining a minute signal, and gate channels of the third MOS transistor and the fourth MOS transistor are larger than those of the other transistors.

16. The semiconductor device in accordance with claim 2, wherein:
the third MOS transistor and the fourth MOS transistor form a transistor pair for determining a minute signal, and gate channels of the third MOS transistor and the fourth MOS transistor are larger than those of the other transistors.

17. A semiconductor device comprising:
a pair of signal lines configured to transmit a pair of complementary signals, and are a first signal line and a second signal line;
a first transistor coupled between the first signal line and a first common node, the first transistor including a gate electrode coupled to one of a control node and the second signal line; and
a second transistor coupled between the first common node and a predetermined signal line, the second transistor including a gate electrode coupled to an other of the control node and the second signal line, and the second transistor includes a channel region larger in width than that of the first transistor.

18. The semiconductor device in accordance with claim 17, further comprising:
a third transistor which is coupled between the second signal line and a second common node, the third transistor including a gate electrode coupled to one of the control node and the first signal line; and a fourth transistor which is coupled between the second common node and the predetermined signal line, the fourth transistor including a gate electrode coupled to the other of the control node and the first signal line, and the fourth transistor includes a channel region larger in width than that of the third transistor.

19. The semiconductor device in accordance with claim 17, wherein the gate electrode of the first transistor is elongated in a first direction, and the gate electrode of the second transistor is elongated in a second direction different from the first direction.

20. The semiconductor device in accordance with claim 17, wherein the second transistor has a threshold voltage smaller than that of the first transistor.

21. The semiconductor device in accordance with claim 18, wherein the fourth transistor has a threshold voltage smaller than that of the third transistor.

* * * * *